(12) United States Patent
Wang et al.

(10) Patent No.: US 9,748,163 B1
(45) Date of Patent: Aug. 29, 2017

(54) DIE SUPPORT FOR ENLARGING DIE SIZE

(71) Applicant: SEMICONDUCTOR COMPONENTS INDUSTRIES, LLC, Phoenix, AZ (US)

(72) Inventors: Soon Wei Wang, Seremban (MY); How Kiat Liew, Bukit Jalil (MY); Chee Hiong Chew, Seremban (MY); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/230,749

(22) Filed: Aug. 8, 2016

(51) Int. Cl.
  *H01L 23/495* (2006.01)
  *H01L 21/48* (2006.01)
  *H01L 21/56* (2006.01)

(52) U.S. Cl.
  CPC .... *H01L 23/49503* (2013.01); *H01L 21/4853* (2013.01); *H01L 21/4867* (2013.01); *H01L 21/565* (2013.01); *H01L 23/4952* (2013.01); *H01L 23/49558* (2013.01)

(58) Field of Classification Search
None
See application file for complete search history.

(56) References Cited

U.S. PATENT DOCUMENTS

| 7,247,526 B1* | 7/2007 | Fan | H01L 21/4832 |
| | | | 257/E23.124 |
| 2006/0001136 A1* | 1/2006 | Tao | H01L 23/49503 |
| | | | 257/676 |
| 2007/0018290 A1* | 1/2007 | Punzalan | H01L 23/3107 |
| | | | 257/666 |
| 2009/0315161 A1* | 12/2009 | Bayan | H01L 23/4951 |
| | | | 257/666 |
| 2011/0057296 A1* | 3/2011 | Feng | H01L 23/13 |
| | | | 257/618 |
| 2016/0005680 A1* | 1/2016 | Israel | H01L 23/49568 |
| | | | 257/675 |

* cited by examiner

*Primary Examiner* — Charles Garber
*Assistant Examiner* — Alia Sabur
(74) *Attorney, Agent, or Firm* — Conley Rose, P.C.

(57) ABSTRACT

A chip package, in some embodiments, comprises: a die flag; one or more die supports; and a die mounted on the die flag and on said one or more die supports, at least one surface of said die having an area larger than an area of at least one surface of the die flag.

19 Claims, 6 Drawing Sheets

DIE SUPPORT FOR ENLARGING DIE SIZE

BACKGROUND

Chips are used in a variety of electronic devices to perform one or more functions within such devices. For instance, a microprocessor chip may perform some or all of the central processing unit functions in a mobile phone. These chips are typically housed within packages that protect the chip from damage. Packages may be composed of any suitable insulating material, such as an epoxy mold. A lead frame mechanically supports the chip and includes leads or electrical terminals that are exposed to the external surfaces of the package, thus providing multiple electrical pathways between the package and another electronic device to which the package leads or terminals are coupled.

Part of this lead frame is a die flag on which the die is mounted within the package. Because the die is mounted on the die flag, the size of the die flag dictates the size of the die—that is, the area of the die flag surface to which the die is mounted dictates the area of the die surface mounted to the die flag. The die area should be the same size as, or smaller than, the die flag area. If the die area is larger than the die flag area, the die will extend over one or more edges of the die flag. This overextension makes the die and associated connections (e.g., wire bonds that electrically couple the die to leads or terminals) susceptible to mechanical stress and damage.

SUMMARY

At least some of the embodiments disclosed herein are directed to a chip package, comprising: a die flag; one or more die supports; and a die mounted on the die flag and on said one or more die supports, at least one surface of said die having an area larger than an area of at least one surface of the die flag. One or more of these embodiments may be supplemented using one or more of the following concepts, in any order and in any combination: wherein the one or more die supports at least partially surrounds the die flag in at least one plane; wherein each of the one or more die supports comprises a pair of segments, each segment in said pair runs parallel to a different edge of the die flag; wherein the one or more die supports comprises four die supports, each of the four die supports runs parallel to a different edge of the die flag; wherein the chip package is a leadless land grid array (LLGA) package.

At least some embodiments are directed to a chip package, comprising: one or more electrical terminals exposed to one or more outer surfaces of the chip package; a die flag; one or more die supports; a die mounted on said die flag and on said one or more die supports; and one or more electrical connections between the die and said one or more electrical terminals. One or more of these embodiments may be supplemented using one or more of the following concepts, in any order and in any combination: wherein at least one of the one or more die supports is non-conductive; wherein at least one of the one or more die supports comprises epoxy; wherein at least one of the one or more die supports is at least partially colored black; wherein said one or more die supports surrounds the die flag in at least one plane; wherein at least one of the one or more die supports contains multiple segments, each of said segments runs parallel to a different edge of the die flag; wherein at least one of the one or more die supports runs parallel to a single edge of the die flag; wherein the one or more electrical connections comprises wire bonds; wherein said chip package is a quad flat no-leads (QFN) package; wherein said chip package is a leadless land grid array (LLGA) package.

At least some embodiments are directed to a method for manufacturing a chip package, comprising: providing a carrier having a die flag formed thereupon; positioning one or more die supports on said carrier; mounting a die on said die flag and on the one or more die supports; electrically coupling said die to one or more electrical terminals of the carrier; and encapsulating at least the die flag, the one or more die supports, and the die using a mold compound. One or more of these embodiments may be supplemented using one or more of the following concepts, in any order and in any combination: wherein said positioning comprises a technique selected from the group consisting of printing, dispensing and stamping; further comprising removing the carrier from the chip package; wherein said electrical coupling comprises forming wire bonds; wherein said one or more die supports include a non-conductive epoxy.

Figure 1A:
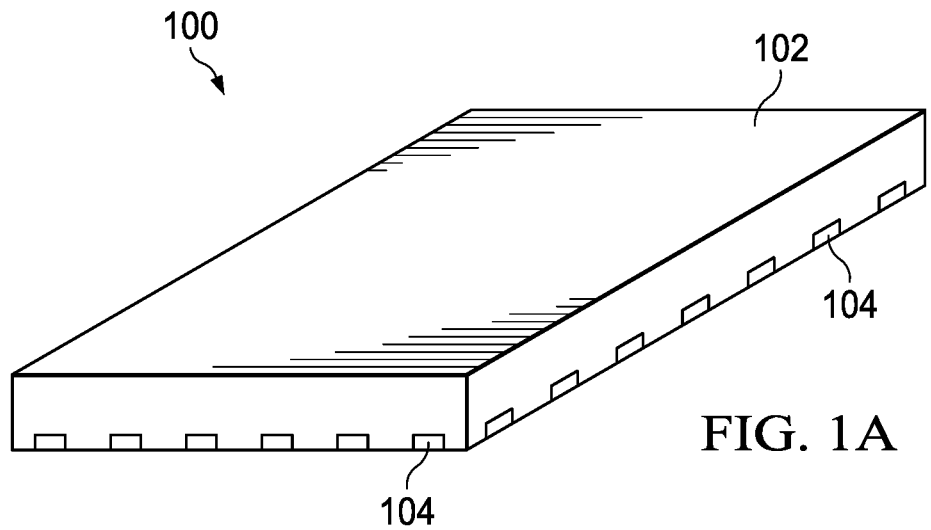
FIGS. 1A-1B depict perspective and bottom-up views, respectively, of illustrative chip packages within which the disclosed die supports may be implemented.

It should be understood that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are various embodiments of chip packages containing die supports that facilitate an increase in die size relative to packages that do not contain such die supports. The die supports are non-conductive structures formed on the carrier (e.g., lead frame) and adjacent to the die flag. The die is mounted on both the die flag and on the die supports, thus distributing the weight of the die and forces acting upon the die over the die flag and the die supports. In this way, the die supports mitigate the risk of damage (e.g., to the die or to wire bonds coupling the die to electrical terminals) that would otherwise result when an oversized die is mounted on a die flag alone. As a result, oversized die may be incorporated into chip packages that would otherwise be unable to accommodate such die sizes. The die supports may be composed of any suitable, non-conductive material (e.g., an epoxy), and they may be formed in any suitable size and shape. Furthermore, the die supports may be positioned in any desirable location relative to the die flag. The top surfaces of the die supports preferably are flush with the top surface of the die flag so that the die, when mounted on the die flag and die supports, is substantially parallel (i.e., within ten degrees) to the bottom surface of the chip package.

FIG. 1A is a perspective view of a chip package 100 implementing die supports. Notwithstanding the manner in which the package 100 is depicted in FIG. 1A, the package 100 may be any suitable type of package, such as a quad flat no-lead (QFN) package, a leadless land grid array (LLGA) package, a traditional package having leads, or any other suitable type of package. The package 100 includes an encapsulation mold (e.g., epoxy) 102 and a plurality of electrical terminals 104 exposed through multiple surfaces of the package 100. Although not expressly depicted in the perspective view of FIG. 1A, additional terminals may be exposed via the bottom surface of the package 100.

Figure 1B:
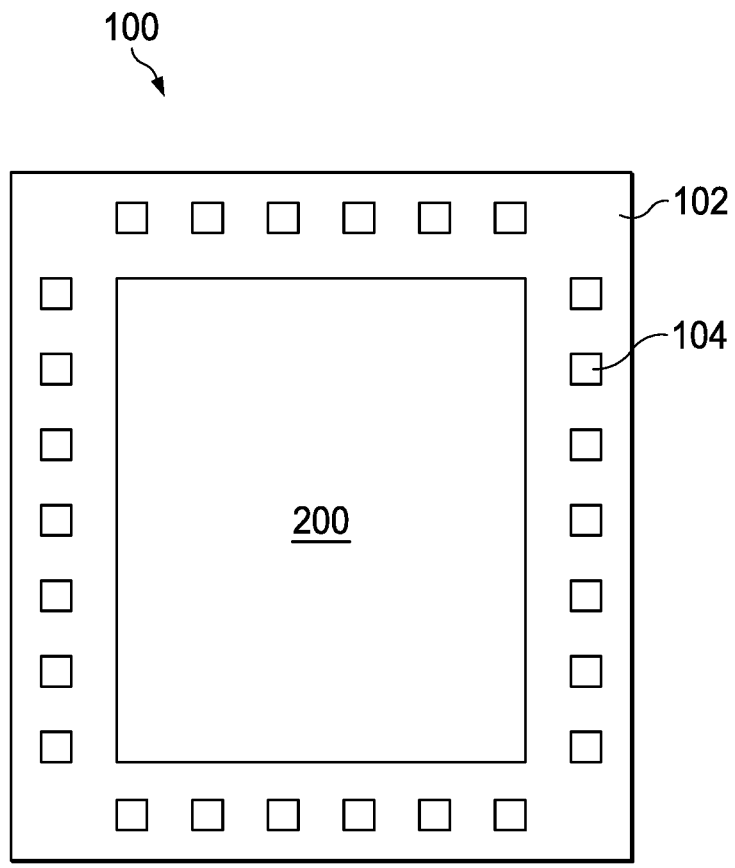

FIG. 1B is a bottom-up view of another chip package 100. This package 100 includes an encapsulation material (e.g., epoxy) 102 and a plurality of electrical terminals 104 on the bottom surface of the package 100, as shown. A bottom surface of a die flag 200 is exposed via the bottom surface of the chip package 100, although in some embodiments, a different component—e.g., a heat dissipation component—may be exposed via the bottom surface of the chip package 100 instead of the die flag 200. The chip packages depicted in FIGS. 1A and 1B are merely illustrative and do not limit the scope of this disclosure. The die supports disclosed herein may be incorporated into any suitable type of chip package.

Figure 2:
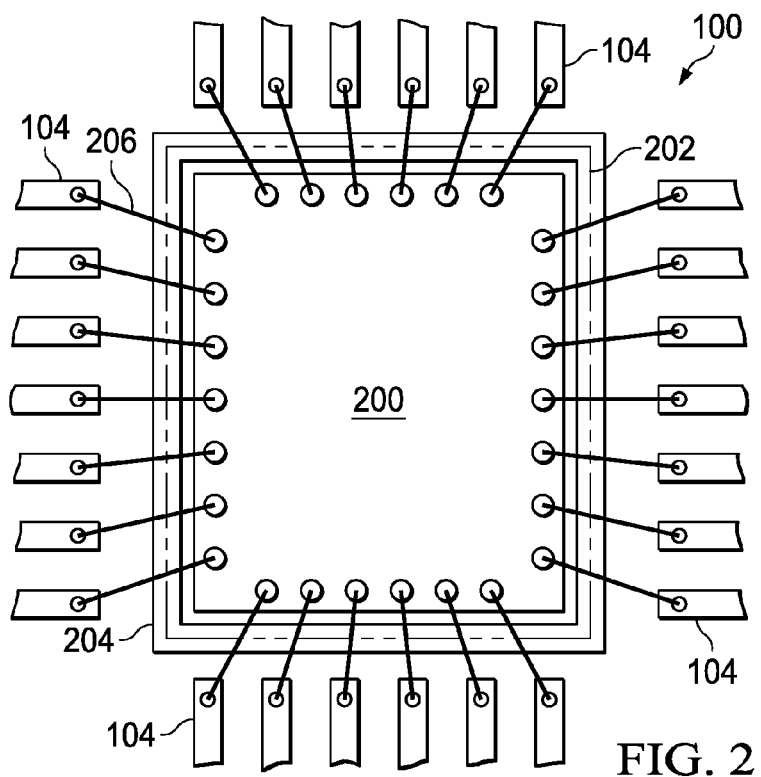
FIGS. 2-4 show top-down views of the contents of chip packages implementing die supports.

FIG. 2 is a top-down view of the contents of an illustrative chip package 100, which includes a plurality of electrical terminals 104, a die flag 200, a die support 204, and a die 202 mounted on the die flag 200 and the die support 204. The package 100 further includes a plurality of wire bonds (e.g., composed of gold) between die pads (not expressly shown) on the die 202 and the electrical terminals 104. The wire bonds facilitate communication of signals between the die 202 and the terminals 104. Any suitable number of wire bonds and electrical terminals 104 may be used. The die support 204 in FIG. 2 is depicted as fully encircling the perimeter of the die flag 200. The die support 204 comprises multiple segments, with each of the segments running parallel to a different edge of the die flag 200. The die support 204 fully surrounds the perimeter of the die flag 200 in at least one plane, although in other embodiments such as those described below, the die support(s) may only partially surround the die flag 200. The shape and size of the die support 204 may differ from that depicted in FIG. 2. For example, the die support 204 may be wider or narrower than shown; it may be set farther away from the perimeter of the die flag 200; it may have a top surface that is flat or rounded; and it may be segmented into multiple pieces, as shown and described with respect to FIGS. 3 and 4 below. The die support 204 is composed of any suitable, insulating material, such as an epoxy (e.g., a black epoxy for cosmetic purposes) that is printed, deposited or stamped and subsequently cured, as described below. The surface of the die 202 that interfaces with the die flag 200 and the die support 204 preferably has a larger area than the area of the surface of the die flag 200 that interfaces with the die 202. Thus, the die 202 is oversized relative to the die flag and the die support 204 is used to support the die 202. In at least some embodiments, the die support 204 and the die flag 200 have the same or similar heights such that the die 202 mounted thereupon is substantially parallel (i.e., within ten degrees) to the bottom surface of the chip package 100.

Figure 3:
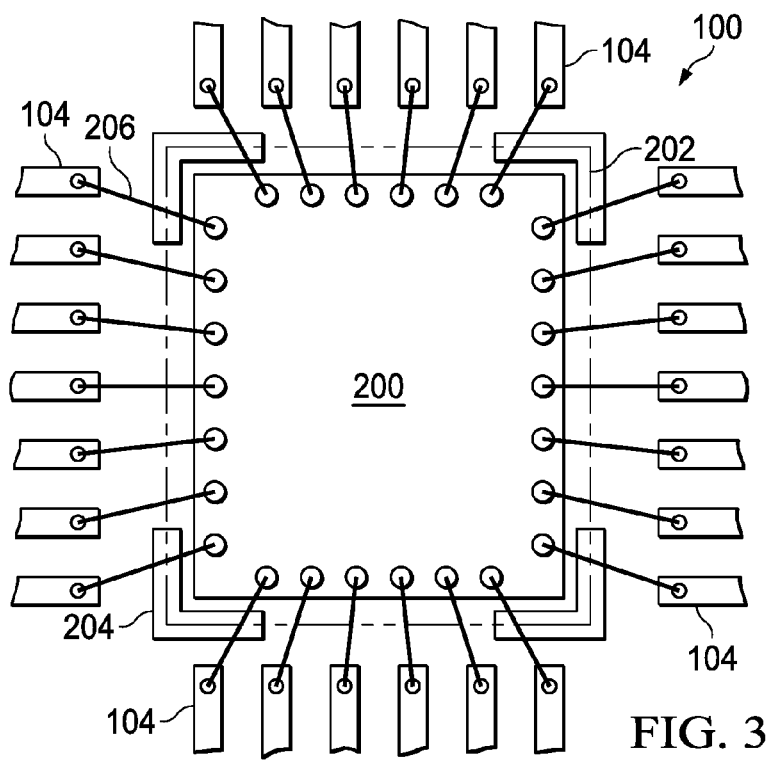

FIG. 3 is another top-down view of the contents of an illustrative chip package 100. The chip package contents depicted in FIG. 3 are similar to those shown in FIG. 2 with the exception of the die supports 204. The contents shown in FIG. 3 contain multiple die supports 204, with each die support 204 having multiple segments, each segment running parallel to a different edge of the die flag 200. Variations of the die supports 204 are contemplated. For instance, one of the die supports 204 may have three segments, each running parallel with a different edge of the die flag 200. Similarly, one or more of the die supports 204 may have different sizes or shapes than shown. In at least some embodiments, the die supports 204 and the die flag 200 have the same or similar heights such that the die 202 mounted thereupon is substantially parallel (i.e., within ten degrees) to the bottom surface of the chip package 100.

Figure 4:
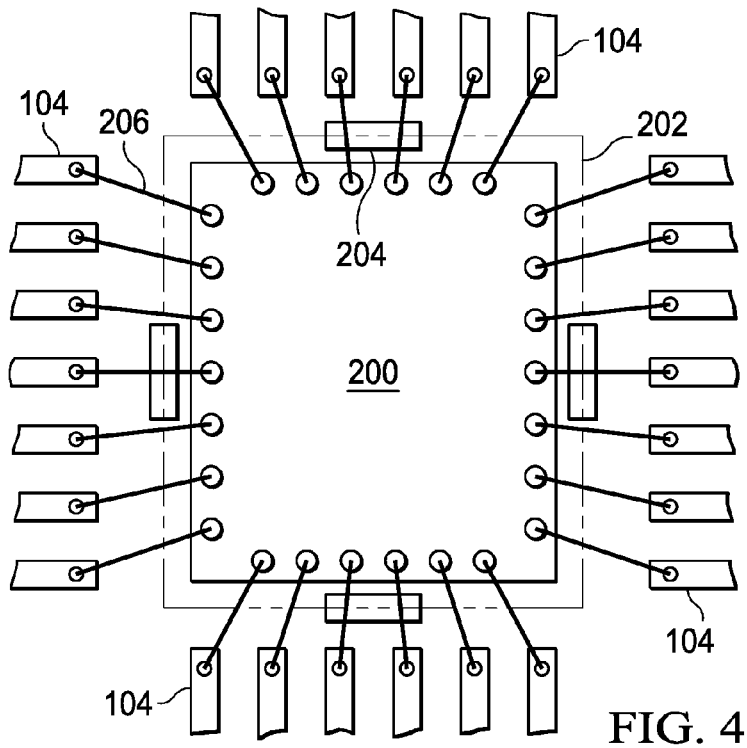

FIG. 4 is another top-down view of the contents of a chip package 100. The chip package contents depicted in FIG. 4 are similar to those shown in FIGS. 2 and 3 with the exception of the die supports 204. The contents shown in FIG. 4 contain multiple die supports 204, with each die support 204 running parallel to a different edge of the die flag 200. Variations of the die supports 204 are contemplated. For instance, one or more of the die supports 204 may have a different size or shape than one or more of the other die supports 204. Alternatively, all of the die supports 204 may have different sizes or shapes than shown. In some embodiments, the die supports 204 of FIG. 2 may be combined with the die supports 204 of FIG. 3. In other embodiments, a subset of the die supports 204 of FIG. 2 may be combined with a subset of the die supports 204 of FIG. 3. Any and all such combinations are contemplated and fall within the scope of this disclosure. In at least some embodiments, the die supports 204 and the die flag 200 have the same or similar heights such that the die 202 mounted thereupon is substantially parallel (i.e., within ten degrees) to the bottom surface of the chip package 100.

Figure 5:
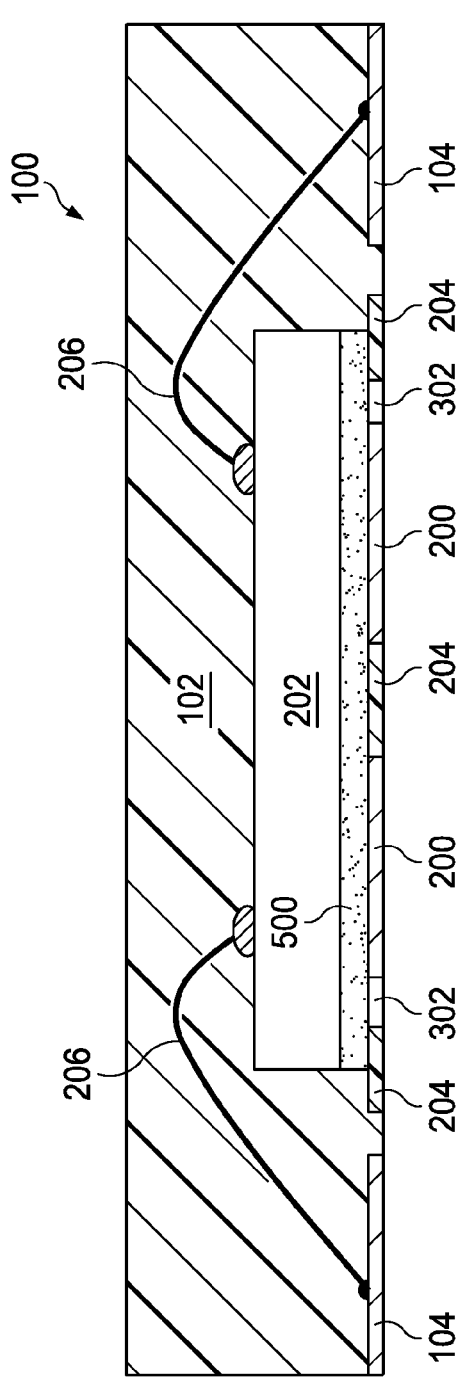
FIG. 5 shows a side view of a chip package implementing die supports.

FIG. 5 is a side view of the contents of an illustrative chip package 100. The chip package 100 comprises a die 202 mounted on the die flag 200 and on multiple die supports 204 by way of a die bond layer 500. The contents of the chip package 100 are encapsulated by a suitable encapsulating material 102 (e.g., epoxy). The particular configuration of die supports 204 shown in FIG. 5 is similar to that shown in FIG. 4. As shown, the top surfaces of the die supports 204 and the die flag 200 are flush with each other so that the die 202 is substantially parallel with the bottom surface of the chip package 100. Numerals 302 depict standoff gaps between the die flag 200 and the die supports 204. The die supports 204 are not restricted to the specific configurations shown in the various figures, and any and all variations thereof are contemplated and included within the scope of this disclosure. The die 202 electrically couples to the electrical terminals 104 via electrical connections 206 (e.g., wire bonds).

Figure 7:
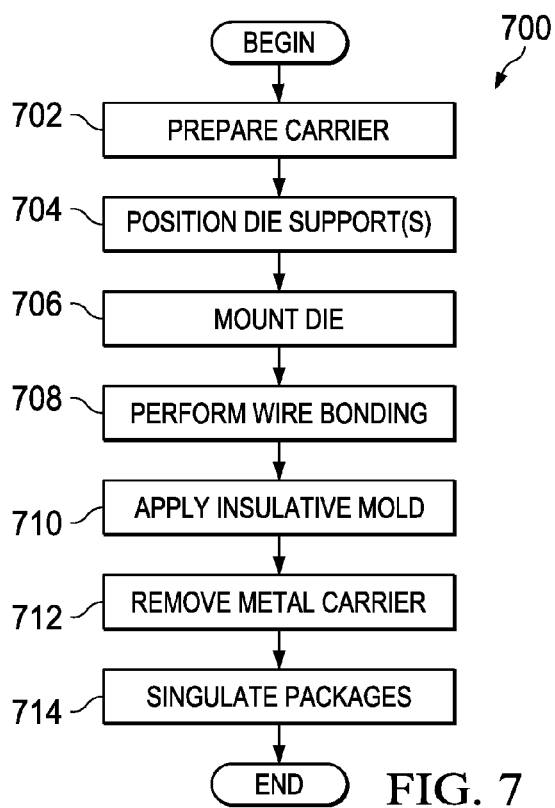
FIG. 7 provides a flow diagram describing a chip package fabrication method.
Figure 6A:
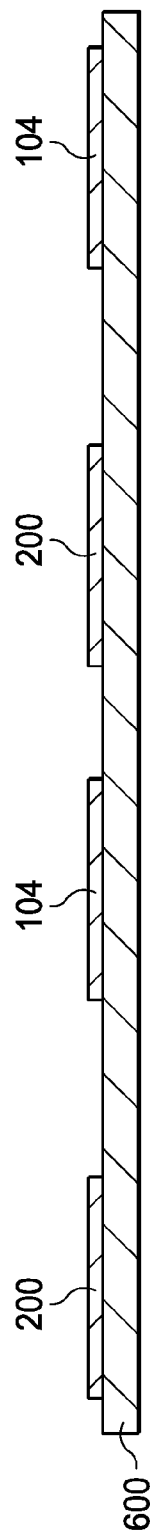
FIGS. 6A-6G depict side views of a chip package fabrication process.

FIGS. 6A-6G depict a step-by-step process by which a chip package 100 may be fabricated. FIG. 7 is a flow diagram of a method 700 describing such a fabrication process. Accordingly, FIGS. 6A-6G and 7 are now described in tandem. The method 700 begins with preparing or providing a metal carrier (step 702). The metal carrier may be composed of, e.g., copper or a copper alloy and may be etched or stamped using a copper plate or copper alloy plate. The metal carrier may, for instance, be a conventional LLGA lead frame. The metal carrier is formed so that it includes a die flag and one or more terminals. FIG. 6A depicts the result of this step—specifically, a carrier 600 including die flags 200 and terminals 104. The carrier 600 depicted in FIG. 6A includes multiple die flags and multiple terminals because the chip packages are produced in bulk and later singulated into individual chip packages.

Figure 6B:
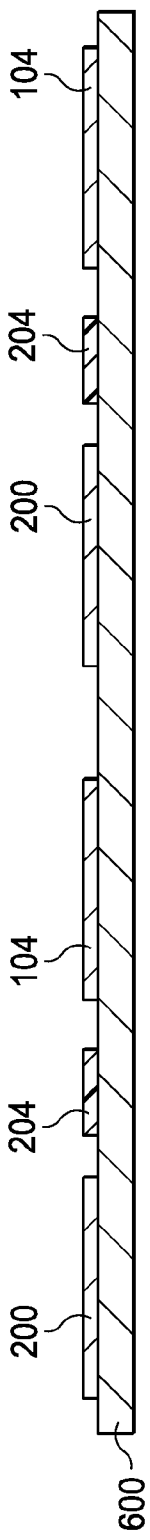

The method 600 next includes positioning one or more die supports on the carrier 600 (step 704). FIG. 6B depicts such die supports 204. As explained above, these die supports may be in any number, in any shape, in any size and in any position, as desired and as may be suitable. Illustrative, non-limiting examples of die support configurations are provided in FIGS. 2-5 and are described above. Preferably, at least one die support is provided for each die flag 200 on the carrier 600. In at least some embodiments, the die supports 204 are composed of epoxy (e.g., black epoxy for cosmetic purposes). The die supports 204 may be printed, dispensed or stamped onto the carrier 600. In some cases, an insulated adhesive may be used. Regardless of the technique used, the die supports 204 are placed on the carrier 600 and subsequently cured.

Figure 6C:
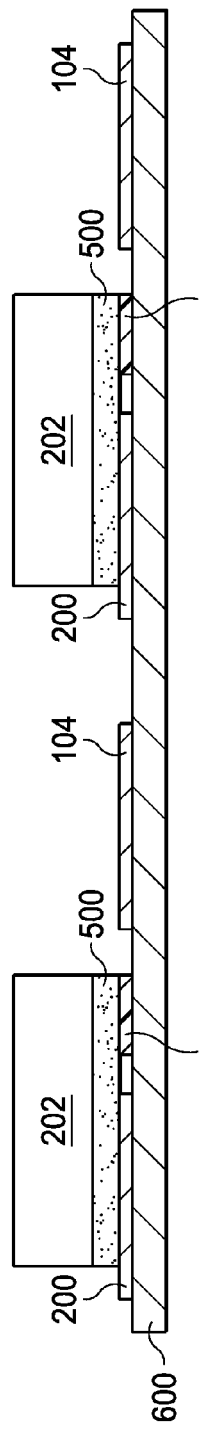

The method 600 next includes mounting the die on the die flag 200 and the die supports 204 (step 706). FIG. 6C depicts this step. Die bonds 500 are applied to the multiple die 202. In some embodiments, a wafer-back coated epoxy may be used. In some embodiments, die attach films may be laminated onto the back of the die. The die 202 are then flipped over and mounted to the die flag 200 and the die supports 204. As explained above, the area of the surface of the die 202 that will couple to the die flag 200 and the die supports 204 is larger than the area of the surface of the die flag 200 that will couple to the die 202. Accordingly, the die 202 is supported by both the die flag 200 and the die supports 204, as shown. FIG. 6C depicts the die 202 being unevenly mounted on the die flags 200 and die supports 204, meaning that each of the die 202 occupies the entire available surface of the corresponding die support 204 but does not occupy the entire available surface of the corresponding die flag 200. Such configurations may be implemented as necessary to achieve proper support for the die 202, proper support for the wire bonds that will subsequently be implemented, or any other design consideration.

Figure 6D:
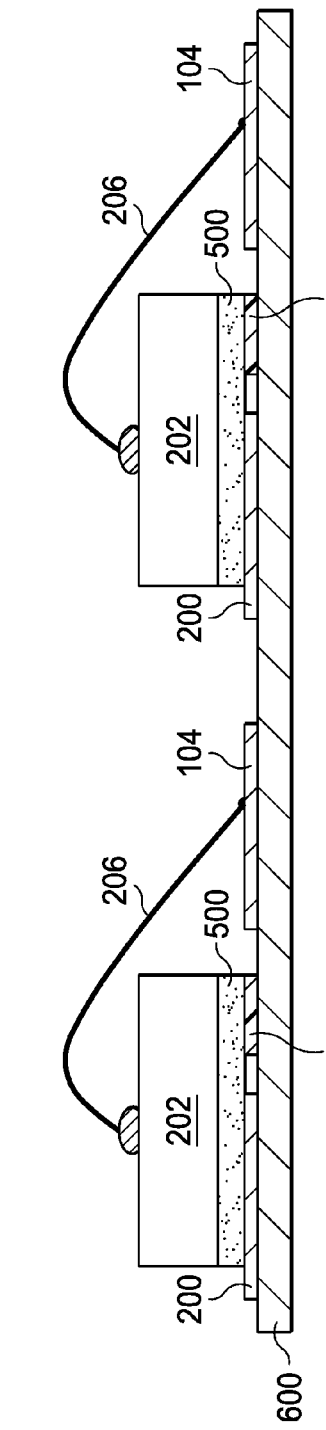

The method 600 subsequently comprises electrically coupling each of the die 202 (e.g., die pads on the die 202) to the terminals 104 (step 708). As FIG. 6D depicts, this may be accomplished using wire bonds 206 (composed of, e.g., gold). Traditional wire bonding techniques may be used to establish such electrical connections.

Figure 6E:
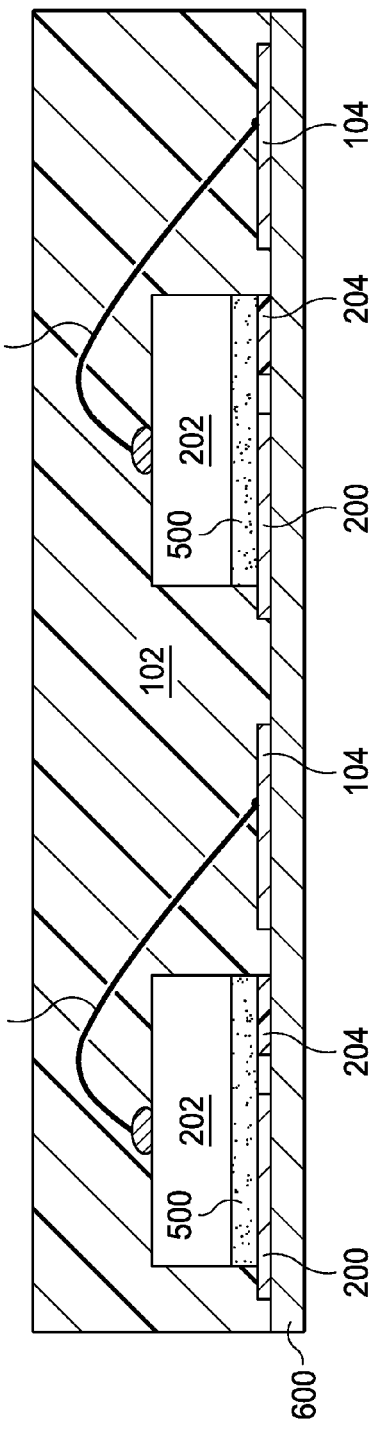
Figure 6F:
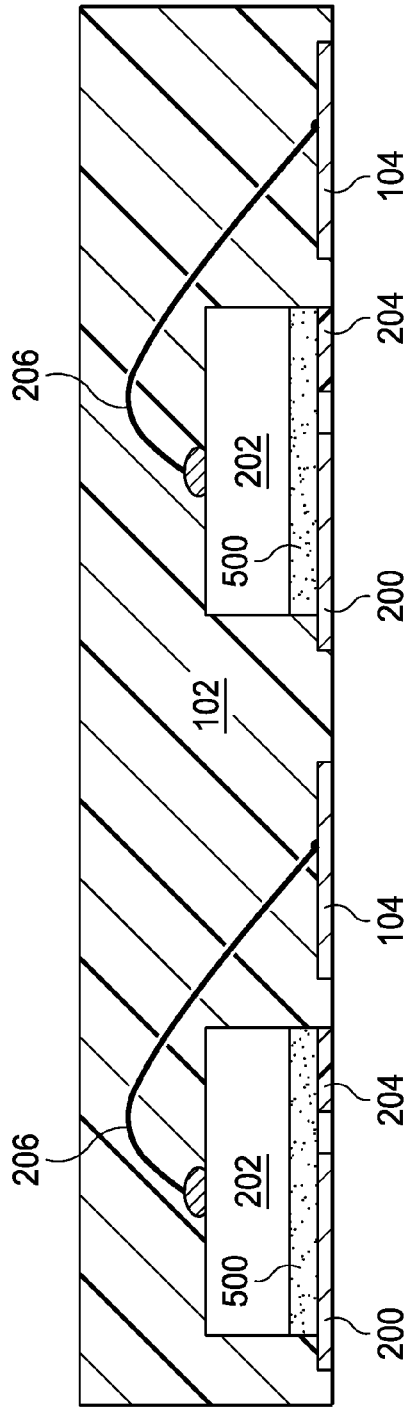
Figure 6G:
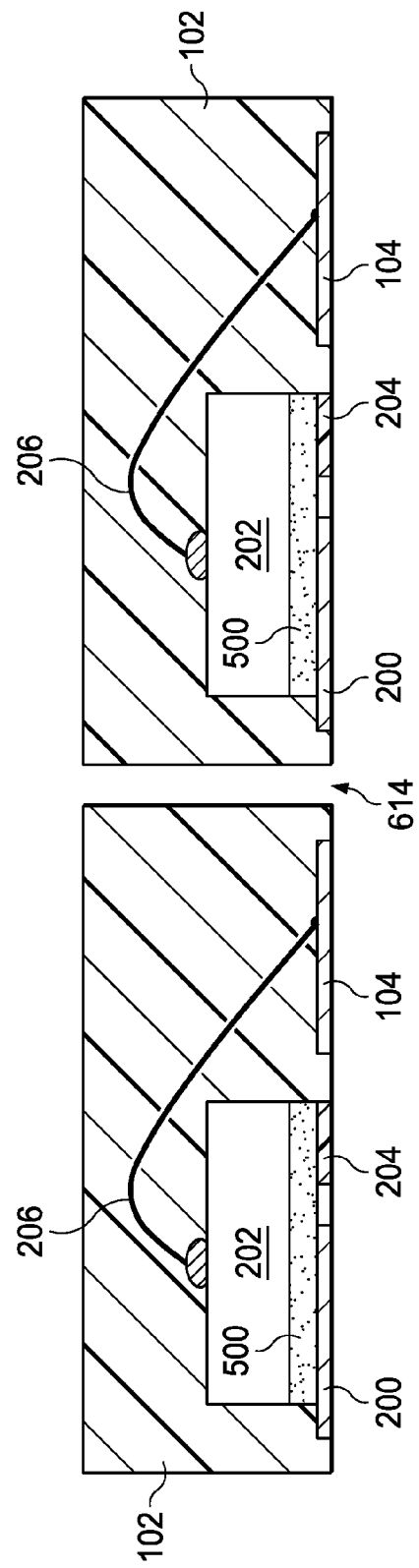

The method 600 next includes applying an insulating mold to the components depicted in FIG. 6E (step 710). FIG. 6E depicts such a mold 102. Any suitable material may be used for the mold 102. For example, the mold 102 may comprise a suitable epoxy material. Next, the carrier 600 is removed (step 712). The carrier 600 may be removed using, for instance, a suitable etching or peeling technique. For example, an acidic or alkaline-base copper etching material may be used to etch away the carrier 600. FIG. 6F depicts the assembly with the carrier 600 removed. Because the carrier 600 is removed, the die flags 200, the die supports 204 and the electrical terminals 104 are exposed via the bottom surface of the assembly, as shown. Finally, the method 600 comprises singulating the assembly using, e.g., a diamond blade to produce multiple, separate chip packages, as depicted in FIG. 6G (step 714).

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A chip package, comprising:
   a die flag;
   one or more electrical terminals;
   one or more die supports physically separate from the one or more electrical terminals; and
   a die mounted on the die flag and on said one or more die supports, the die electrically coupled to the one or more electrical terminals, at least one surface of said die having an area larger than an area of at least one surface of the die flag,
   wherein at least one of the one or more die supports is non-conductive.

2. The chip package of claim 1, wherein the one or more die supports at least partially surrounds the die flag in at least one plane.

3. The chip package of claim 1, wherein each of the one or more die supports comprises a pair of segments, each segment in said pair runs parallel to a different edge of the die flag.

4. The chip package of claim 1, wherein the one or more die supports comprises four die supports, each of the four die supports runs parallel to a different edge of the die flag.

5. The chip package of claim 1, wherein the chip package is a leadless land grid array (LLGA) package.

6. A chip package, comprising:
   one or more electrical terminals exposed to one or more outer surfaces of the chip package;
   a die flag;
   one or more die supports positioned between the die flag and the one or more electrical terminals in at least one plane, the one or more die supports physically separate from the one or more electrical terminals and from the die flag;
   a die mounted on said die flag and on said one or more die supports; and
   one or more electrical connections between the die and said one or more electrical terminals,
   wherein at least one of the one or more die supports is non-conductive.

7. The chip package of claim 6, wherein at least one of the one or more die supports comprises epoxy.

8. The chip package of claim 6, wherein at least one of the one or more die supports is at least partially colored black.

9. The chip package of claim 6, wherein said one or more die supports surrounds the die flag in at least one plane.

10. The chip package of claim 6, wherein at least one of the one or more die supports contains multiple segments, each of said segments runs parallel to a different edge of the die flag.

11. The chip package of claim 6, wherein at least one of the one or more die supports runs parallel to a single edge of the die flag.

12. The chip package of claim 6, wherein the one or more electrical connections comprises wire bonds.

13. The chip package of claim 6, wherein said chip package is a quad flat no-leads (QFN) package.

14. The chip package of claim 6, wherein said chip package is a leadless land grid array (LLGA) package.

15. A method for manufacturing a chip package, comprising:
   providing a carrier having a die flag formed thereupon;
   positioning one or more die supports on said carrier;
   mounting a die on said die flag and on the one or more die supports;
   electrically coupling said die to one or more electrical terminals of the carrier, the one or more electrical terminals physically separate from the one or more die supports; and encapsulating at least the die flag, the one or more die supports, and the die using a mold compound, wherein at least one of the one or more die supports is non-conductive.

16. The method of claim 15, wherein said positioning comprises a technique selected from the group consisting of printing, dispensing and stamping.

17. The method of claim 15, further comprising removing the carrier from the chip package.

18. The method of claim 15, wherein said electrical coupling comprises forming wire bonds.

19. The method of claim 15, wherein said at least one of the one or more die supports includes a non-conductive epoxy.

\* \* \* \* \*